United States Patent
Shingu et al.

(10) Patent No.: US 10,269,821 B2
(45) Date of Patent: Apr. 23, 2019

(54) THREE-DIMENSIONAL SEMICONDUCTOR MEMORY DEVICE AND METHOD FOR MANUFACTURING THE SAME

(71) Applicant: TOSHIBA MEMORY CORPORATION, Minato-ku (JP)

(72) Inventors: Masao Shingu, Yokkaichi (JP); Katsuyuki Sekine, Yokkaichi (JP); Hirokazu Ishigaki, Yokkaichi (JP); Makoto Fujiwara, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 109 days.

(21) Appl. No.: 15/046,054

(22) Filed: Feb. 17, 2016

(65) Prior Publication Data

US 2017/0062451 A1   Mar. 2, 2017

Related U.S. Application Data

(60) Provisional application No. 62/210,160, filed on Aug. 26, 2015.

(51) Int. Cl.
*H01L 27/11578*  (2017.01)
*H01L 27/11563*  (2017.01)
*H01L 27/1157*   (2017.01)

(52) U.S. Cl.
CPC .... *H01L 27/11563* (2013.01); *H01L 27/1157* (2013.01); *H01L 27/11578* (2013.01)

(58) Field of Classification Search
CPC .................................................. H01L 27/11578
USPC ........................................................ 257/326
See application file for complete search history.

(56) References Cited

U.S. PATENT DOCUMENTS

| | | | |
|---|---|---|---|
| 8,866,139 B2 | 10/2014 | Ino | |
| 2012/0184078 A1* | 7/2012 | Kiyotoshi | H01L 27/1157 438/268 |
| 2015/0194440 A1 | 7/2015 | Noh et al. | |
| 2015/0200199 A1 | 7/2015 | Sakamoto et al. | |
| 2016/0056169 A1* | 2/2016 | Lee | H01L 27/11565 438/269 |

* cited by examiner

*Primary Examiner* — Hsin Yi Hsieh
(74) *Attorney, Agent, or Firm* — Oblon, McClelland, Maier & Neustadt, L.L.P.

(57) ABSTRACT

A semiconductor memory device includes first and second electrode films, an interlayer insulating film, a semiconductor pillar, and a first insulating film. The first electrode film extends in a first direction. The second electrode film is provided separately from the first electrode film in a second direction and extends in the first direction. The interlayer insulating film is provided between the first and the second electrode films. The first insulating film includes first and second insulating regions. A concentration of nitrogen in the first position of the second insulating region is higher than a concentration of nitrogen in the second position between the first position and the semiconductor pillar. A concentration of nitrogen in the first insulating region is lower than the concentration of the nitrogen in the first position.

16 Claims, 12 Drawing Sheets

THREE-DIMENSIONAL SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/210,160 filed on Aug. 26, 2015; the entire contents of which are incorporated herein by reference.

FIELD

Embodiments described herein relate generally to a semiconductor memory device and a method for manufacturing the same.

BACKGROUND

There is a stacked semiconductor memory device including memory cells that are three-dimensionally disposed for increasing the degree of integration of memory. The semiconductor memory device includes a plurality of semiconductor pillars extending in a stacking direction and a plurality of electrode films (word lines) that extend in a direction intersecting the stacking direction and are arranged in the stacking direction. A memory cell is formed between the semiconductor pillar and the electrode film. In such a semiconductor memory device, it is desired to make the data erasing characteristics of the memory cell favorable.

DETAILED DESCRIPTION

Figure 1:
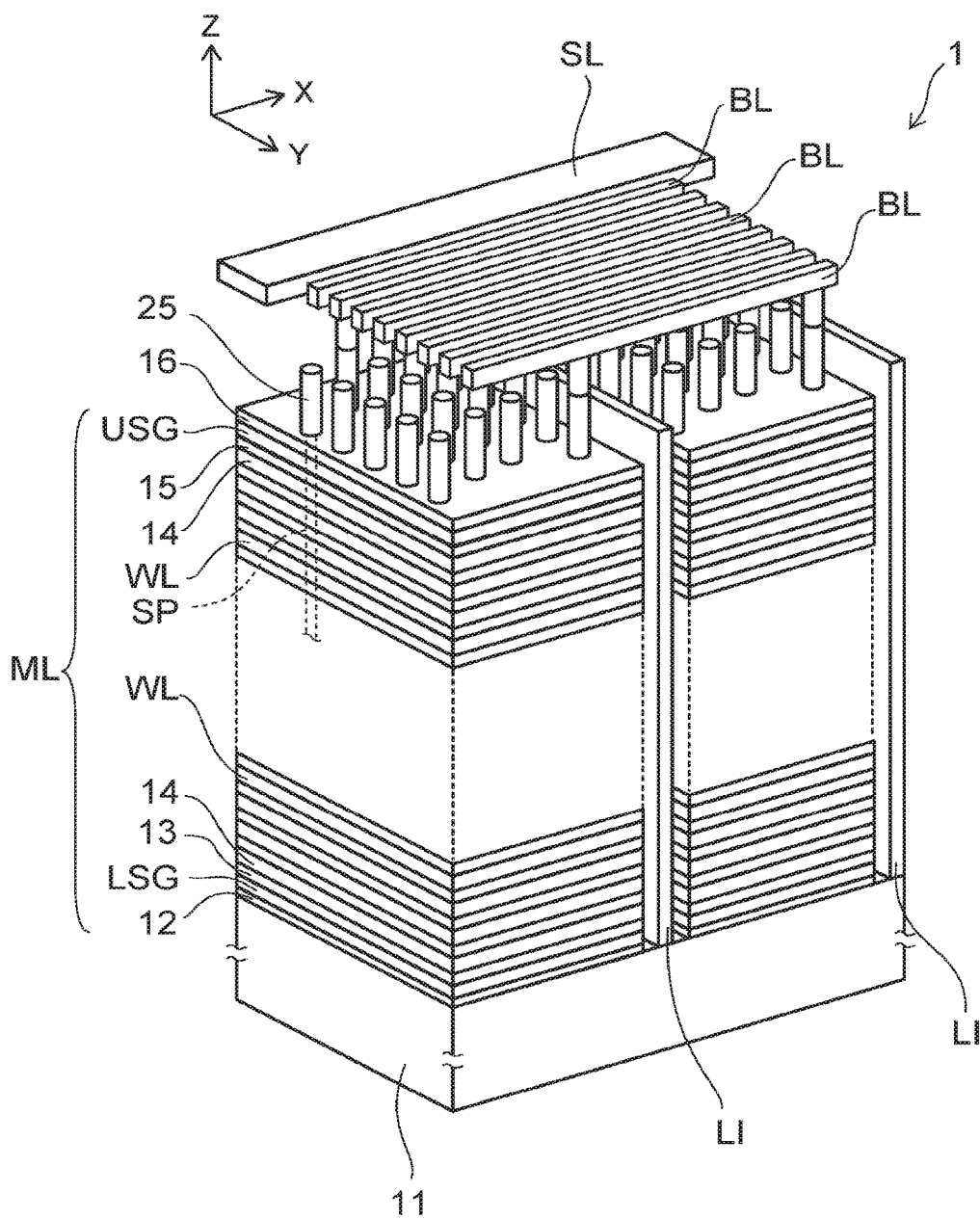
FIG. 1 is a schematic perspective view illustrating a semiconductor memory device according to a first embodiment.

According to one embodiment, a semiconductor memory device includes a first electrode film, a second electrode film, an interlayer insulating film, a semiconductor pillar, and a first insulating film. The first electrode film extends in a first direction. The second electrode film is provided separately from the first electrode film in a second direction intersecting the first direction and extends in the first direction. The interlayer insulating film is provided between the first electrode film and the second electrode film. The semiconductor pillar pierces the first electrode film, the second electrode film, and the interlayer insulating film in the second direction. The first insulating film includes a first insulating region and a second insulating region. The first insulating region is provided between the first electrode film and the semiconductor pillar and between the second electrode film and the semiconductor pillar. The second insulating region is provided between the interlayer insulating film and the semiconductor pillar. A concentration of nitrogen in a first position of the second insulating region is higher than a concentration of nitrogen in a second position between the first position and the semiconductor pillar. A concentration of nitrogen in the first insulating region is lower than the concentration of the nitrogen in the first position.

Hereinafter, embodiments of the invention will be described with reference to the drawings.

The drawings are schematic or conceptual, and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic perspective view illustrating a semiconductor memory device according to a first embodiment.

Figure 2:
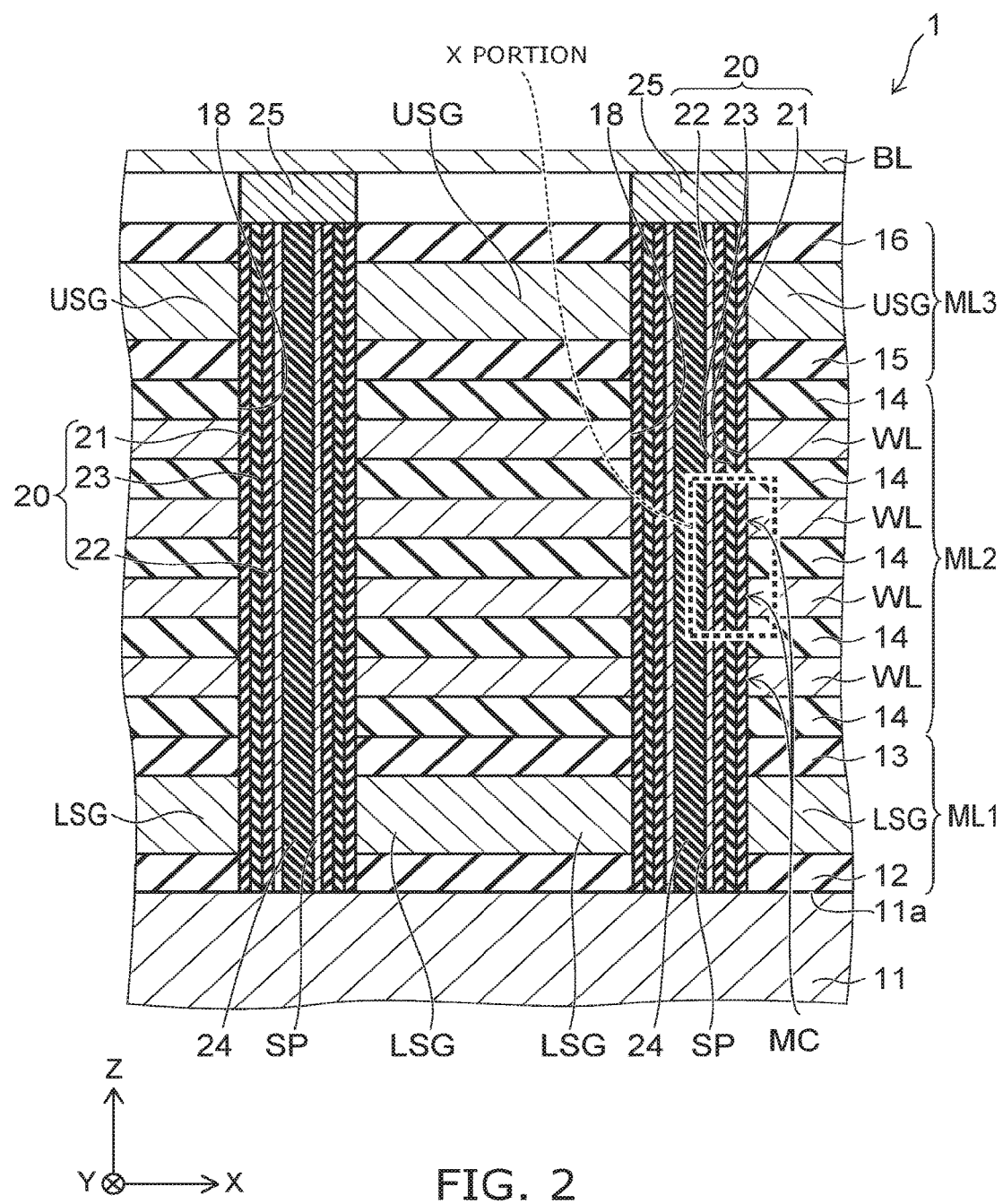
FIG. 2 is a schematic cross-sectional view illustrating a part of the semiconductor memory device according to the first embodiment.

FIG. 2 is a schematic cross-sectional view illustrating a part of the semiconductor memory device according to the first embodiment.

Incidentally, in FIG. 1, conductive members are mainly shown and insulating members are only partially shown for the sake of convenience of illustration. In FIG. 2, only two semiconductor pillars and their surroundings are shown. As the semiconductor pillar, for example, a silicon pillar is used.

A semiconductor memory device 1 according to the embodiment is, for example, a three-dimensionally stacked flash memory. The semiconductor memory device 1 includes a plurality of electrode films WL that are stacked separately from one another. By piercing these electrode films WL with a plurality of semiconductor pillars SP, a cell transistor is formed at each of intersecting portions between the electrode films WL and the semiconductor pillars SP. In each cell transistor, a charge storage film is provided, and by storing electrical charges in this charge storage film, each cell transistor functions as a memory cell MC that stores data.

As shown in FIGS. 1 and 2, in the semiconductor memory device 1 according to the embodiment, a substrate 11 is provided. As a material of the substrate 11, for example, silicon (Si) is used.

Hereinafter, in the specification, an XYZ perpendicular coordinate system is adopted for the sake of convenience of explanation. Two directions that are parallel to an upper surface 11a of the substrate 11 and perpendicular to each other are defined as an "X-direction" and a "Y-direction", and a direction that is perpendicular to the upper surface 11a of the substrate 11, that is, a perpendicular direction is defined as a "Z-direction".

On the substrate 11, a lower gate stacked body ML1 is provided. In the lower gate stacked body ML1, an insulating film 12, a lower select gate electrode LSG, and an insulating film 13 are stacked in this order.

On the lower gate stacked body ML1, a memory stacked body ML2 is provided. The memory stacked body ML2 includes a plurality of electrode films WL and a plurality of interlayer insulating films 14. The electrode films WL and the interlayer insulating films 14 are alternately stacked. That is, between the adjacent two electrode films WL, one interlayer insulating film 14 is provided. The electrode film WL functions as a word line of the semiconductor memory device 1. The interlayer insulating film 14 functions as an insulating film that insulates the adjacent two electrode films WL. The interlayer insulating film 14 is provided also on the uppermost electrode film WL. Incidentally, in the example of FIG. 1, four electrode films WL are provided. The number of electrode films WL is not limited thereto.

On the memory stacked body ML2, an upper gate stacked body ML3 is provided. In the upper gate stacked body ML3, an insulating film 15, an upper select gate electrode USG, and an insulating film 16 are stacked in this order.

Each of the upper select gate electrode USG and the lower select gate electrode LSG is provided by dividing one conductive film in the X-direction and is composed of a plurality of conductive members extending in the Y-direction. The electrode film WL is divided in an erase block unit. The electrode film WL is composed of one conductive film that is parallel to an X-Y plane in the erase block. For each of the lower select gate electrode LSG, the electrode film WL, and the upper select gate electrode USG, for example, a metal such as tungsten (W) is used as a conductive material. For each of the insulating films 12, 13, 15, and 16, and the interlayer insulating film 14, for example, a silicon oxide film or the like is used as an insulating material. Incidentally, at an arbitrary position between the respective films, a film necessary for a manufacturing process, for example, a stopper film using silicon nitride or the like may be provided.

In the lower gate stacked body ML1, the memory stacked body ML2, and the upper gate stacked body ML3 (hereinafter, these are collectively referred to as "stacked body ML"), a plurality of through-holes (memory holes) 18 extending in the stacking direction (Z-direction) is provided. Each of the plurality of through-holes 18 pierces the stacked body ML. On an inner side surface of each of the through-holes 18, a memory film 20 is provided. In an inner side surface of the memory film 20, a semiconductor pillar SP is provided. Therefore, the semiconductor pillar SP also pierces the stacked body ML. The shape of the semiconductor pillar SP is a hollow column (tube), and can be, for example, a circular tube. As a material of the semiconductor pillar SP, for example, polysilicon or the like can be used. A hollow portion surrounded by the semiconductor pillar SP is filled with, for example, silicon oxide or the like as a core material 24.

The semiconductor pillar SP is provided throughout the entire length of the stacked body ML in the stacking direction. A lower end portion of the semiconductor pillar SP is electrically connected to a source layer SL through an interlayer interconnect layer LI. The source layer SL forms an upper layer interconnect along with bit lines BL. On an upper end portion of the semiconductor pillar SP, a plug conductive layer 25 is provided. On the plug conductive layer 25, a bit line BL extending in the X-direction is provided. The upper end portion of the semiconductor pillar SP is electrically connected to the bit line BL through the plug conductive layer 25.

In the stacked body ML, the interlayer interconnect layer LI that spreads in the Y-direction and the Z-direction in the stacked body ML is disposed. A lower end portion of the interlayer interconnect layer LI is disposed in the substrate 11. The lower end portion of the interlayer interconnect layer LI is electrically connected to each of the semiconductor pillars SP through the substrate 11. An upper end portion of the interlayer interconnect layer LI is electrically connected to the source layer SL.

In the memory film 20, a second insulating film 22, a charge storage film 23, and a first insulating film 21 are stacked in the order from a side of the semiconductor pillar SP. The first insulating film 21 functions as a part of a block insulating film, and the second insulating film 22 functions as a tunnel insulating film.

The second insulating film 22 is a film which usually shows insulating properties, but causes an FN tunneling current to flow therethrough when a predetermined voltage within a driving range of the semiconductor memory device 1 is applied thereto. The charge storage film 23 is a film having an ability to store electrical charges, and for example, a material having an electron trap site is used.

Figure 3:
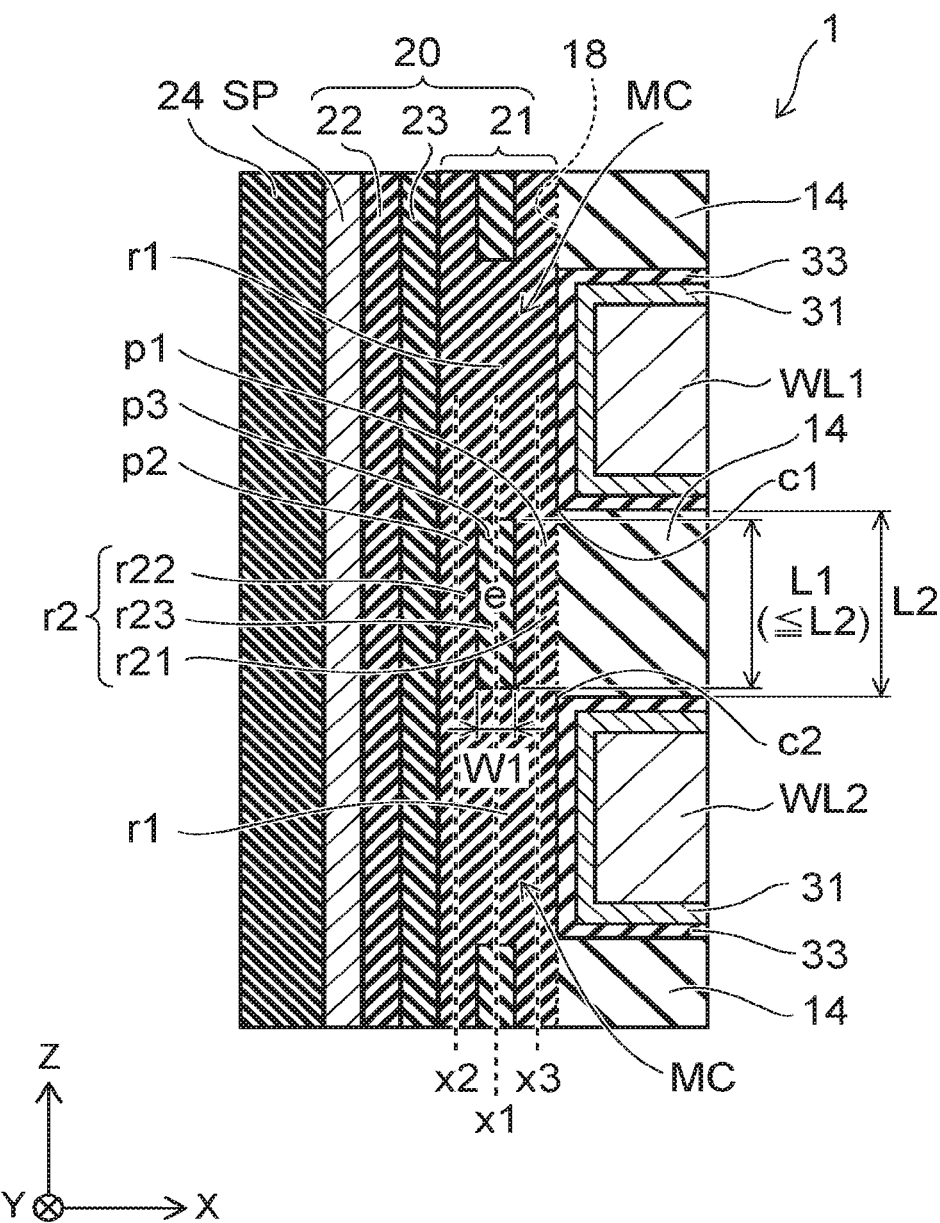
FIG. 3 is an enlarged schematic partial cross-sectional view of a X portion of FIG. 2.
Figure 4:
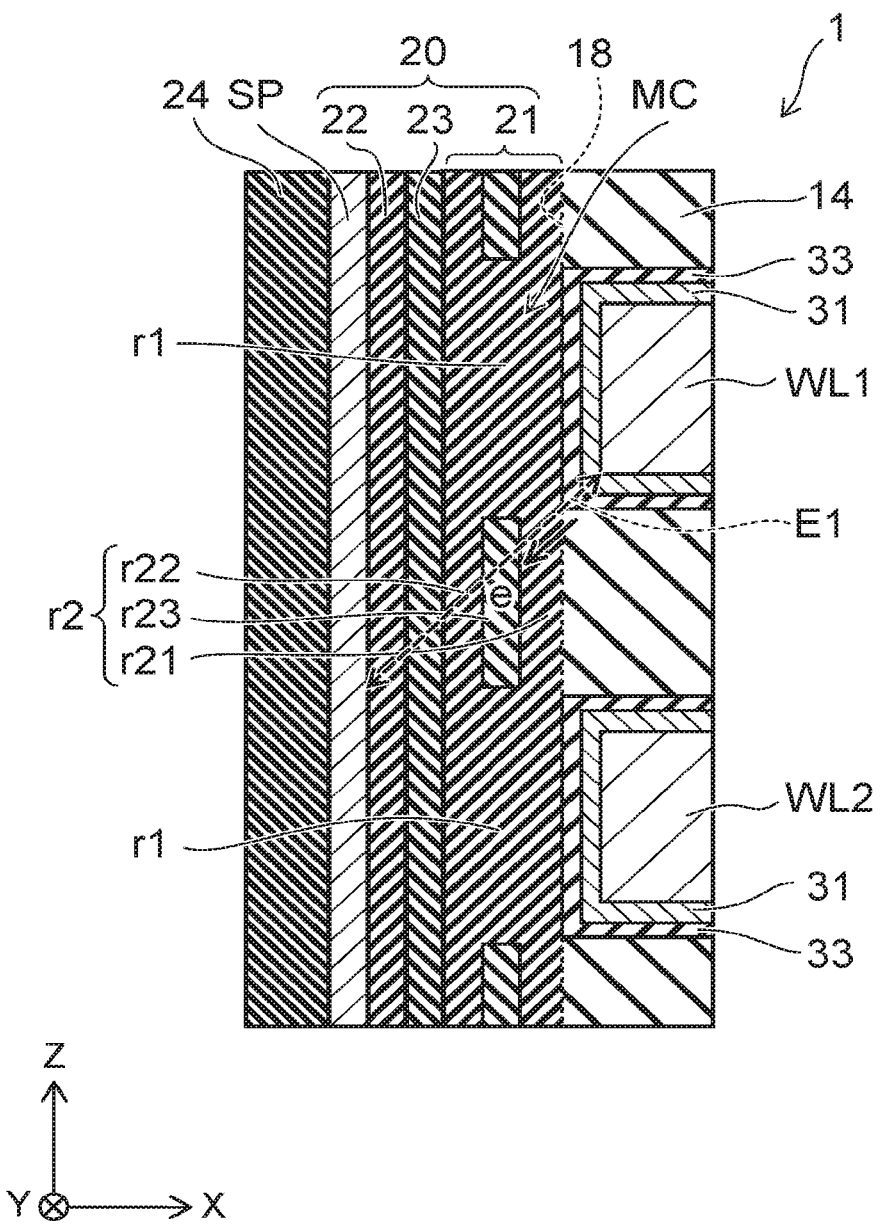
FIG. 4 is an enlarged schematic partial cross-sectional view of a X portion of FIG. 2.

FIGS. 3 and 4 are enlarged schematic partial cross-sectional views of an X portion of FIG. 2.

The semiconductor memory device 1 according to the embodiment includes a substrate 11, a semiconductor pillar SP, a first electrode film WL1, a second electrode film WL2, an interlayer insulating film 14, a charge storage film 23, a first insulating film 21, and a second insulating film 22. In this example, a first direction is the Y-direction; a second direction is the Z-direction; and a third direction is the X-direction.

As shown in FIG. 3, the first electrode film WL1 extends in the Y-direction. The first electrode film WL1 is one of the plurality of electrode films WL. The second electrode film WL2 is provided separately from the first electrode film WL1 in the Z-direction and extends in the Y-direction. The second electrode film WL2 is another one of the plurality of electrode films WL. The interlayer insulating film 14 is provided between the first electrode film WL1 and the second electrode film WL2. The semiconductor pillar SP pierces the first electrode film WL1, the second electrode film WL2, and the interlayer insulating film 14 in the Z-direction.

The first insulating film 21 includes a first insulating region r1 and a second insulating region r2. The first insulating region r1 is provided between the first electrode film WL1 and the semiconductor pillar SP and between the second electrode film WL2 and the semiconductor pillar SP. The second insulating region r2 is provided between the interlayer insulating film 14 and the semiconductor pillar SP. The charge storage film 23 is provided between the semiconductor pillar SP and the first insulating film 21. The second insulating film 22 is provided between the semiconductor pillar SP and the charge storage film 23. That is, the second insulating film 22, the charge storage film 23, and the first insulating film 21 are provided along the Z-direction in the order of proximity to the semiconductor pillar SP.

For the interlayer insulating film 14, for example, silicon oxide such as $SiO_2$ is used. For the charge storage film 23, for example, silicon nitride is used. For the second insulating film 22, for example, silicon oxide such as $SiO_2$ is used. For the second insulating film 22, for example, an ONO film (Oxide-Nitride-Oxide) may be used.

In the embodiment, a concentration of nitrogen in a first position x1 of the second insulating region r2 is higher than a concentration of nitrogen in a second position x2 of the second insulating region r2. The second position x2 is located between the first position x1 and the semiconductor pillar SP. A concentration of nitrogen of the first insulating region r1 is lower than a concentration of nitrogen in the first position x1. The concentration of nitrogen in the first position x1 is higher than a concentration of nitrogen in a third position x3 of the second insulating region r2. The third position x3 is located between the first position x1 and the interlayer insulating film 14.

In the embodiment, the second insulating region r2 includes a first portion p1, a second portion p2, and a third portion p3. The second portion p2 is provided between the first portion p1 and the semiconductor pillar SP. The third portion p3 is provided between the first portion p1 and the second portion p2. The first portion p1, the second portion p2, and the third portion p3 overlap with one another in the X-direction. The concentration of nitrogen in the third portion p3 is higher than the concentration of nitrogen in the first portion p1 and the concentration of nitrogen in the second portion p2. The concentration of nitrogen in the first insulating region r1 is lower than the concentration of nitrogen in the third portion p3. For example, at a first position x1 along the X-direction of the third portion p3, the concentration of nitrogen in the first insulating region r1 is lower than the concentration of nitrogen in the third portion p3.

Between the first electrode film WL1 and the semiconductor pillar SP and between the second electrode film WL2 and the semiconductor pillar SP, the first insulating region r1, the charge storage film 23, and the second insulating film 22 are provided. Between the interlayer insulating film 14 and the semiconductor pillar SP, the second insulating region r2, the charge storage film 23, and the second insulating film 22 are provided. The concentration of nitrogen in each of the charge storage film 23 and the second insulating film 22 is substantially uniform in the Z-direction. Therefore, the concentration of nitrogen in the entire region between the first electrode film WL1 and the semiconductor pillar SP is lower than the concentration of nitrogen in the entire region between the interlayer insulating film 14 and the semiconductor pillar SP. Similarly, the concentration of nitrogen in the entire region between the second electrode film WL2 and the semiconductor pillar SP is lower than the concentration of nitrogen in the entire region between the interlayer insulating film 14 and the semiconductor pillar SP.

The first insulating region r1 is provided between the first electrode film WL1 and the charge storage film 23 and between the second electrode film WL2 and the charge storage film 23. The first insulating region r1 includes, for example, silicon oxide such as $SiO_2$. The second insulating region r2 is provided between the interlayer insulating film 14 and the charge storage film 23.

For example, the first insulating region r1 is composed of a single layer of a silicon oxide film. The second insulating region r2 is composed of three layers of a first silicon oxide film r21, a second silicon oxide film r22, and a silicon nitride film r23. The first silicon oxide film r21 is provided on the third position x3. The second silicon oxide film r22 is provided on the second position x2. The silicon nitride firm r23 is provided on the first position x1. There is a case that cannot be seen a boundary between the interlayer insulating film 14 and the first silicon oxide film r21. In this case, a line segment connecting a first corner portion c1 of a third insulating film 33 provided around the first electrode film WL1 and a second corner portion c2 of the insulating film 33 provided around the second electrode film WL2 is the boundary. The second insulating region r2 may be composed of two layers of the second silicon oxide film r22 and the silicon nitride film r23.

The first portion p1 includes the first silicon oxide film r21. The second portion p2 includes the second silicon oxide film r22. The third portion p3 includes the silicon nitride film r23. The first silicon oxide film r21 is provided between the silicon nitride film r23 and the interlayer insulating film 14. The first silicon oxide film r21 is, for example, a $SiO_2$ film. The second silicon oxide film r22 is provided between the silicon nitride film r23 and the semiconductor pillar SP. The second silicon oxide film r22 is, for example, a $SiO_2$ film. In this example, on the second insulating region r2, an ONO (Oxide-Nitride-Oxide) film is stacked.

For example, the second silicon oxide film r22 is a $SiO_2$ film including a relatively large amount of nitrogen. The first silicon oxide film r21 is a $SiO_2$ film obtained by oxidizing a silicon nitride film. The first silicon oxide film r21 includes little nitrogen. Therefore, the concentration of nitrogen in the second silicon oxide film r22 may be higher than the concentration of nitrogen in the first silicon oxide film r21.

The concentration of nitrogen in the first silicon oxide film r21 and the concentration of nitrogen in the first insulating region r1 may be made substantially the same.

The silicon nitride film r23 is not present between the first electrode film WL1 and the charge storage film 23 and between the second electrode film WL2 and the charge storage film 23. The silicon nitride film r23 is present only between the interlayer insulating film 14 and the charge storage film 23. A method for manufacturing such a stacked structure will be described later.

As shown in FIG. 3, the length L1 of the silicon nitride film r23 along the Z-direction is not more than the length L2 of the interlayer insulating film 14 along the Z-direction. More desirably, the length L1 is preferably shorter than the length L2. The relationship between the length L1 and the length L2 is, for example, $0 \le (L2-L1) \le 8$ nm. The width W1 of the silicon nitride film r23 along the X-direction is, for example, 1 nm or more and 2 nm or less.

The semiconductor memory device 1 further includes a barrier metal film 31 and the third insulating film 33. The barrier metal film 31 is provided between the first electrode film WL1 and the first insulating region r1 and between the first electrode film WL1 and the interlayer insulating film 14. For the barrier metal film 31, for example, titanium nitride (TiN) or the like is used. The third insulating film 33 is provided between the barrier metal film 31 and the first insulating region r1 and between the barrier metal film 31 and the interlayer insulating film 14. For the third insulating film 33, for example, aluminum oxide such as $Al_2O_3$ is used. By combining the third insulating film 33 and the first insulating film 21, a block insulating film is formed. The first insulating film 21 and the third insulating film 33 are films which substantially do not cause an electrical current to flow therethrough even if a voltage within a range of the driving voltage of the semiconductor memory device 1 is applied thereto. The barrier metal film 31 and the third insulating film 33 are provided also around the second electrode film WL2 in the same manner as the first electrode film WL1.

Next, with reference to FIG. 4, an effect of the embodiment will be described.

In the embodiment, the silicon nitride film r23 is disposed between the interlayer insulating film 14 and the charge storage film 23 (in the vicinity of a corner portion of the electrode film WL). According to this, back-tunneling electrons e generated by concentration of electric field E1 in the vicinity of the corner portion are trapped, and the flow of the back-tunneling electrons e in the charge storage film 23 can be suppressed.

In the semiconductor memory device 1, negative electrical charges (electrons) are stored in the charge storage film 23 during data writing, and electrons (stored electrons) stored in the charge storage film 23 are erased during data erasing. In this erasing operation, the stored electrons in the charge storage film 23 are erased by neutralization by positive electrical charges (holes) flowing in the charge storage film 23 from the semiconductor pillar SP (channel layer) through the second insulating film 22.

In the vicinity of the corner portion (edge portion) of each of the first electrode film WL1 and the second electrode film WL2, concentration of electric field E1 occurs. Therefore, back-tunneling electrons e (negative electrical charges) are generated more in the vicinity of the corner portion than in the other portions. If the silicon nitride film r23 is not provided between the interlayer insulating film 14 and the charge storage film 23, the back-tunneling electrons e flow in the charge storage film 23 through the block insulating film (the first insulating film 21 and the third insulating film 33). The back-tunneling electrons e flowing therein are neutralized by the positive holes. Therefore, the stored electrons in the charge storage film 23 to be originally neutralized by the positive holes may not be able to be completely neutralized, and the data erasing characteristics of the memory cell MC are low.

On the other hand, in the embodiment, the silicon nitride film r23 is provided between the interlayer insulating film 14 and the charge storage film 23. The silicon nitride film r23 functions as a layer for trapping back-tunneling electrons e. That is, by providing the silicon nitride film r23 in the vicinity of the corner portion of each of the first electrode film WL1 and the second electrode film WL2, back-tunneling electrons e can be effectively trapped. According to this, the flow of the back-tunneling electrons e in the charge storage film 23 can be suppressed. As a result, the data erasing characteristics of the memory cell MC can be made favorable.

Further, in the embodiment, the silicon nitride film r23 is not disposed between the first electrode film WL1 and the charge storage film 23 and between the second electrode film WL2 and the charge storage film 23. According to this, the increase in detrapped electrons is suppressed, and the threshold voltage fluctuation during data holding can be suppressed.

If a silicon nitride film is present between an electrode film and a charge storage film, the threshold voltage fluctuation during data holding is increased, and therefore, such a case is not preferred. That is, one of the causes of the threshold voltage fluctuation is the presence of detrapped electrons escaping from the charge storage film. The silicon nitride film r23 stores electrons in the same manner as the charge storage film 23. Therefore, in the case where the silicon nitride film r23 is disposed between the electrode film WL and the charge storage film 23, detrapped electrons may be increased to increase the threshold voltage fluctuation.

On the other hand, by not disposing the silicon nitride film r23 between the first electrode film WL1 and the charge storage film 23 and between the second electrode film WL2 and the charge storage film 23, the increase in detrapped electrons is suppressed, and thus, the threshold voltage fluctuation during data holding can be suppressed.

Second Embodiment

FIGS. 5A, 5B, 5C, 6A, 6B, 7A, 7B, and 8 are schematic cross-sectional views in the order of steps illustrating a method for manufacturing a semiconductor memory device according to a second embodiment.

Figures 5A, 5B, 5C:
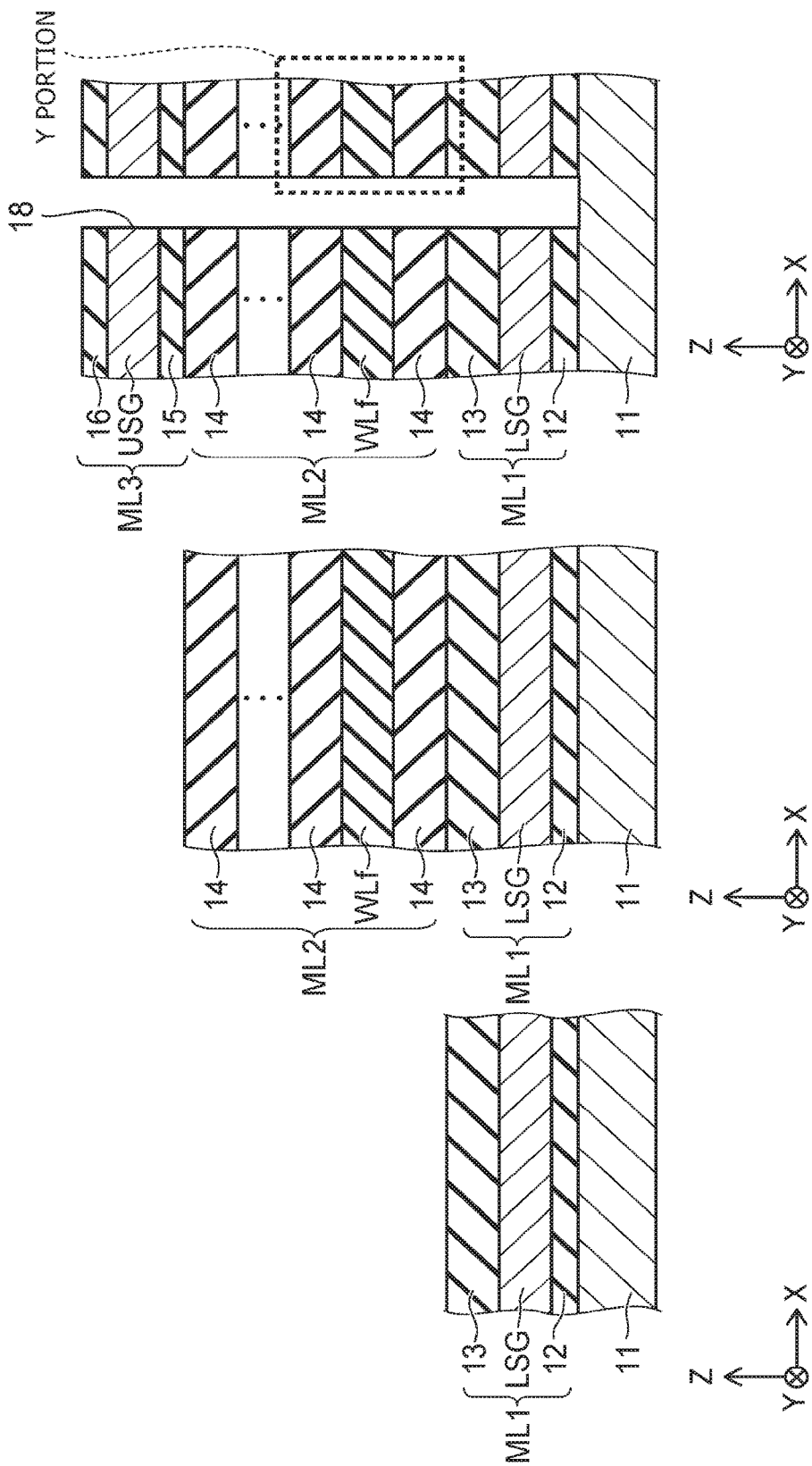
FIG. 5A is a schematic cross-sectional view in the order of steps illustrating a method for manufacturing a semiconductor memory device according to a second embodiment.
FIG. 5B is a schematic cross-sectional view in the order of steps illustrating the method for manufacturing a semiconductor memory device according to the second embodiment.
FIG. 5C is a schematic cross-sectional view in the order of steps illustrating the method for manufacturing a semiconductor memory device according to the second embodiment.

Incidentally, FIGS. 6A, 6B, 7A, 7B, and 8 are enlarged schematic partial cross-sectional views of a Y portion of FIG. 5C.

The second embodiment is a method for manufacturing the semiconductor memory device 1 according to the first embodiment.

As shown in FIG. 5A, in a memory region on a substrate 11, an insulating material such as silicon oxide is deposited and flattened, whereby an insulating film 12 is formed. On this insulating film 12, for example, amorphous silicon is deposited, whereby a lower select gate electrode LSG is formed. Subsequently, on the lower select gate electrode LSG, an insulating film 13 is formed. Thereby, a lower gate stacked body ML1 composed of the insulating film 12, the lower select gate electrode LSG, and the insulating film 13 is formed.

As shown in FIG. 5B, on the lower gate stacked body ML1, for example, an insulating material such as silicon oxide is deposited, whereby an interlayer insulating film 14 is formed. Subsequently, on the interlayer insulating film 14, a first film (hereinafter referred to as "sacrifice film") WLf to be replaced with an electrode film WL in a later step is formed. As a material of the sacrifice film WLf, for example, silicon nitride is used. The interlayer insulating film 14 is formed to a thickness (a length in the Z-direction) of, for example, 10 nm or more and 50 nm or less. The sacrifice film WLf is formed to a thickness (a length in the Z-direction) of, for example, 10 nm or more and 50 nm or less. The interlayer insulating film 14 and the sacrifice film WLf can be formed by using, for example, a reduced pressure CVD (Chemical Vapor Deposition) method.

The interlayer insulating film 14 is formed by, for example, using TEOS (tetraethyl orthosilicate) as a starting material at a deposition temperature of 300° C. or higher and 800° C. or lower under a reduced pressure atmosphere of 2000 Pa or less. The sacrifice film WLf is formed by, for example, using dichlorosilane ($SiH_2Cl_2$) and ammonia ($NH_3$) as starting materials at a deposition temperature of 300° C. or higher and 800° C. or lower under a reduced pressure atmosphere of 2000 Pa or less.

Thereafter, the interlayer insulating film 14 and the sacrifice film WLf are alternately stacked. In this example, four interlayer insulating films 14 and four sacrifice films WLf are formed. Thereby, a memory stacked body ML2 is formed.

As shown in FIG. 5C, on the memory stacked body ML2, for example, an insulating material such as silicon oxide is deposited, whereby an insulating film 15 is formed. On the insulating film 15, for example, amorphous silicon is deposited, whereby an upper select gate electrode USG is formed. On the upper select gate electrode USG, for example, an insulating material such as silicon oxide is deposited, whereby an insulating film 16 is formed. Thereby, an upper gate stacked body ML3 including the upper select gate electrode USG is formed.

For example, by using a photolithography method and an RIE (Reactive Ion Etching) method, a through-hole 18 which pierces the upper gate stacked body ML3, the memory stacked body ML2, and the lower gate stacked body ML1 in the stacking direction to reach the substrate 11 is formed. At this time, a plurality of through-holes 18 arranged in a matrix is simultaneously formed.

Figure 6A:
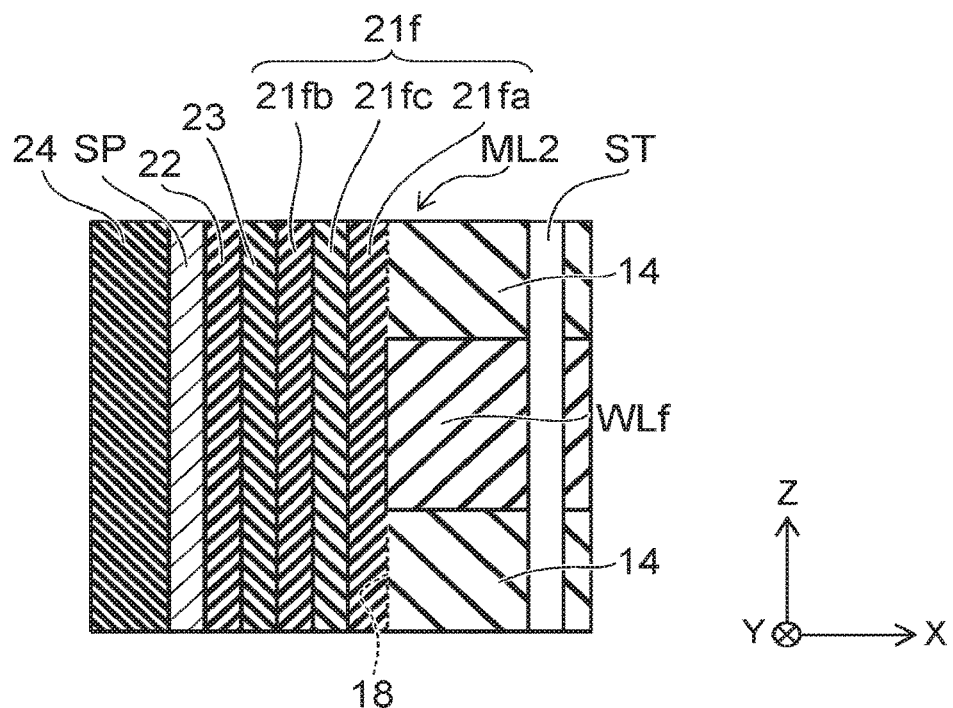
FIG. 6A is a schematic cross-sectional view in the order of steps illustrating the method for manufacturing a semiconductor memory device according to the second embodiment.

As shown in FIG. 6A, along an inner side surface of the through-hole 18, an insulating layer 21f which becomes a first insulating film 21 is formed. Specifically, along an inner side surface of the through-hole 18, a first silicon oxide layer 21fa is formed. Along an inner side surface of the first silicon oxide layer 21fa, a silicon nitride layer 21fc is formed. Along an inner side surface of the silicon nitride layer 21fc, a second silicon oxide layer 21fb is formed. In this manner, the insulating layer 21f is formed.

The silicon nitride layer 21fc is formed by, for example, using an ALD (Atomic Layer Deposition) method at a deposition temperature of 300° C. or higher and 700° C. or lower under a reduced pressure atmosphere of 2000 Pa or less. As a starting material gas, for example, dichlorosilane ($SiH_2Cl_2$) and ammonia ($NH_3$) can be used. Each of the first silicon oxide layer 21fa and the second silicon oxide layer 21fb is formed by, for example, using an ALD method at a deposition temperature of 400° C. or higher and 800° C. or lower under a reduced pressure atmosphere of 2000 Pa or less. As a starting material gas, for example, TDMAS (tetradimethylaminosilane) and ozone ($O_3$) can be used.

Then, along an inner side surface of the second silicon oxide layer 21fb, for example, silicon nitride is deposited, whereby a charge storage film 23 is formed. The charge storage film 23 is formed by, for example, using an ALD method at a deposition temperature of 300° C. or higher and 700° C. or lower under a reduced pressure atmosphere of 2000 Pa or less. As a starting material gas, for example, dichlorosilane ($SiH_2Cl_2$) and ammonia ($NH_3$) can be used.

Along an inner side surface of the charge storage film 23, for example, silicon oxide is deposited, whereby a second insulating film 22 is formed. The second insulating film 22 is formed by, for example, using an ALD method at a deposition temperature of 400° C. or higher and 800° C. or lower under a reduced pressure atmosphere of 2000 Pa or less. As a starting material gas, for example, TDMAS (tetradimethylaminosilane) and ozone ($O_3$) can be used.

Along an inner side surface of the second insulating film 22, for example, amorphous silicon is deposited, and then, amorphous silicon is crystallized (converted to polysilicon) by performing an annealing treatment, whereby a semiconductor pillar SP is formed. The semiconductor pillar SP is formed by, for example, using a CVD method at a deposition temperature of 400° C. or higher and 800° C. or lower under a reduced pressure atmosphere of 2000 Pa or less. As a starting material gas, for example, silane ($SiH_4$) can be used. Incidentally, the inside of the semiconductor pillar SP is filled with for example, silicon oxide such as $SiO_2$ as a core material 24.

A slit (a through portion) ST which pierces the memory stacked body ML2 in the Z-direction to reach the substrate 11 is formed. The slit ST extends in the Y-direction.

Figure 6B:
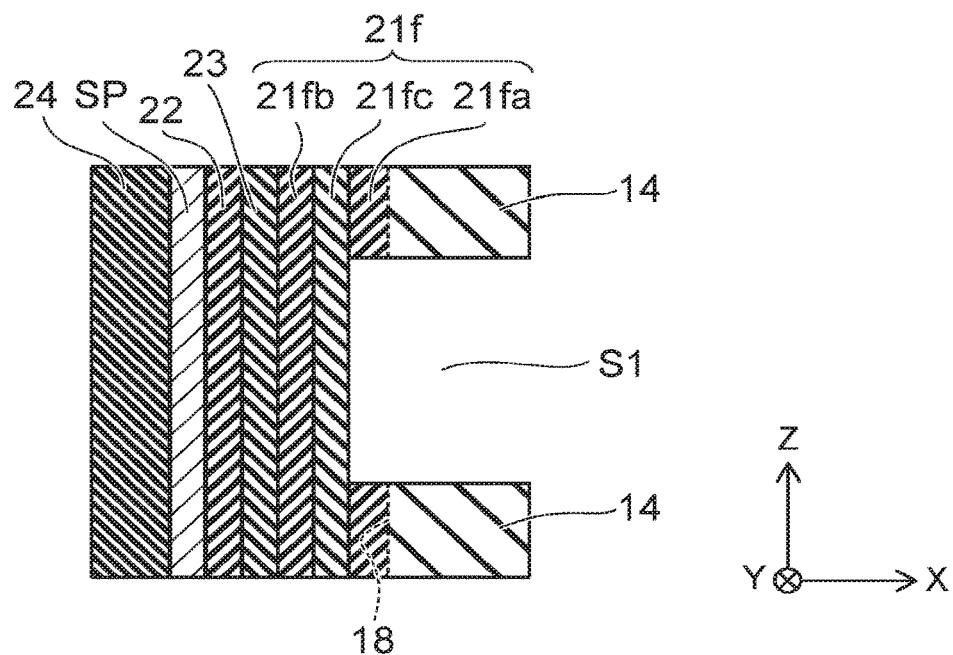
FIG. 6B is a schematic cross-sectional view in the order of steps illustrating the method for manufacturing a semiconductor memory device according to the second embodiment.

As shown in FIG. 6B, the sacrifice film WLf is removed through the slit ST. As a method for removing the sacrifice film WLf, for example, a wet etching method using phosphoric acid ($H_3PO_4$) is used. Thereby, the sacrifice film WLf can be removed.

Further, a portion of the first silicon oxide layer 21fa exposed by removing the sacrifice film WLf is removed. As a method for removing the portion of the first silicon oxide layer 21fa, for example, a wet etching method using hydrofluoric acid (HF) is used. At this time, the silicon nitride layer 21fc functions as an etching stopper layer. Thereby, a space S1 is formed in the portion where the sacrifice film WLf and the portion of the first silicon oxide layer 21fa are removed.

Figure 7A:
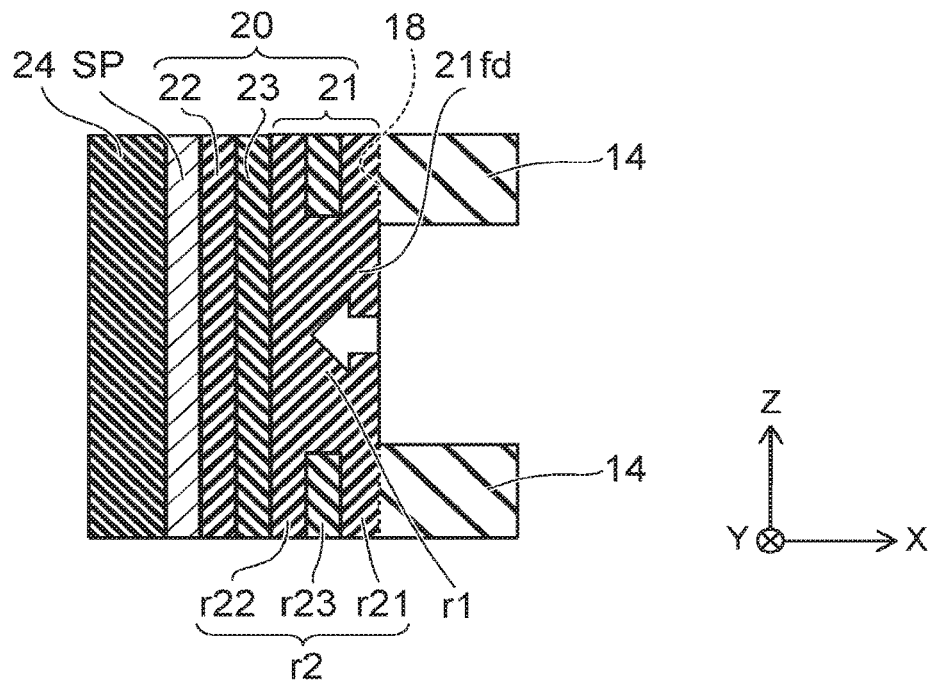
FIG. 7A is a schematic cross-sectional view in the order of steps illustrating the method for manufacturing a semiconductor memory device according to the second embodiment.

As shown in FIG. 7A, a portion of the silicon nitride layer 21fc exposed in the space S1 is oxidized, whereby a third silicon oxide layer 21fd is formed. The oxidation is, for example, radical oxidation. As a radical oxidation method, for example, a heat treatment in a mixed atmosphere of oxygen and hydrogen, or the like is used. Thereby, a first insulating film 21 is formed. That is, a first insulating region r1 and a second insulating region r2 are formed.

Figure 7B:
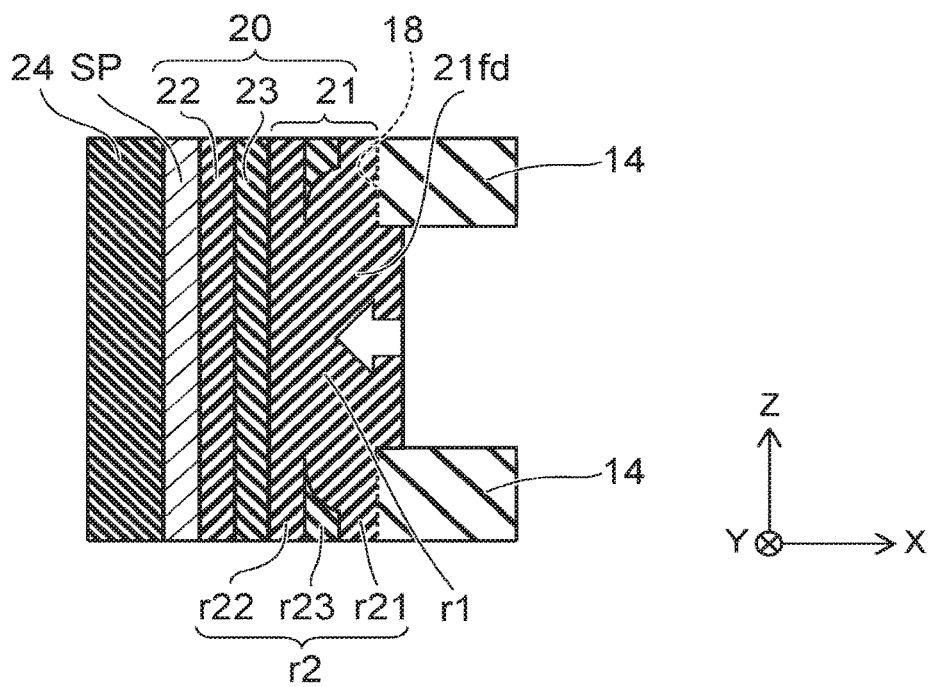
FIG. 7B is a schematic cross-sectional view in the order of steps illustrating the method for manufacturing a semiconductor memory device according to the second embodiment.

A variation of an oxidized state shown in FIG. 7A is shown in FIG. 7B. It is considered that oxidation proceeds isotropically in the silicon nitride layer 21fc. In this case, a boundary between the third silicon oxide layer 21fd and the silicon nitride film r23 may not be linear. In this case, as shown in FIG. 7B, the boundary between the third silicon oxide layer 21fd and the silicon nitride film r23 may be formed in an arc shape. Further, by the oxidation of the silicon nitride layer 21fc, the volume expands, and the film thickness of the third silicon oxide layer 21fd may be increased. Therefore, the third silicon oxide layer 21fd may protrude and expand toward a side of the interlayer insulating film 14.

Figure 8:
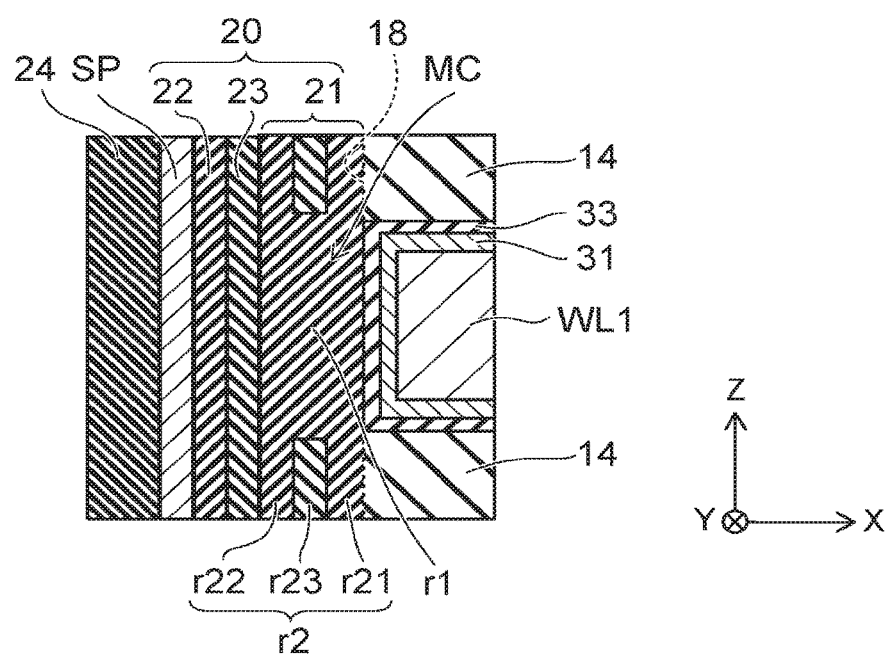
FIG. 8 is a schematic cross-sectional view in the order of steps illustrating the method for manufacturing a semiconductor memory device according to the second embodiment.

As shown in FIG. 8, a third insulating film 33, a barrier metal film 31, and a first electrode film WL1 are formed in this order from an inner wall surface of the space S1. In this manner, the sacrifice film WLf is replaced with the first electrode film WL1. The same shall apply to the electrode films WL other than the first electrode film WL1. Then, on the upper gate stacked body ML3, a plug conductive layer 25, a bit line BL, and a source layer SL are formed in this order.

As described above, the semiconductor memory device 1 having a stacked structure of FIG. 3 can be obtained.

In the manufacturing method of the embodiment, the silicon nitride layer 21fc which becomes a portion of the first insulating film 21 is used as a stopper layer, and a portion of the first silicon oxide layer 21fa which becomes another portion of the first insulating film 21 is etched. Here, an etching fluctuation occurs when removing the sacrifice film WLf. Therefore, a film thickness fluctuation of the first silicon oxide layer 21fa which becomes a portion of the first insulating film 21 occurs. On the other hand, in the process described above, a portion of the first silicon oxide layer 21fa is removed by etching. Therefore, the film thickness fluctuation of the first silicon oxide layer 21fa when removing the sacrifice film WLf can be eliminated. Accordingly, the thickness of the first insulating film 21 can be made substantial uniform.

In this manner, a silicon oxide film can be formed in the first insulating film 21 between the charge storage film 23 and the electrode film WL, and an ONO film including a silicon nitride film can be formed in the first insulating film 21 between the charge storage film 23 and the interlayer insulating film 14.

Third Embodiment

Figures 9A, 9B:
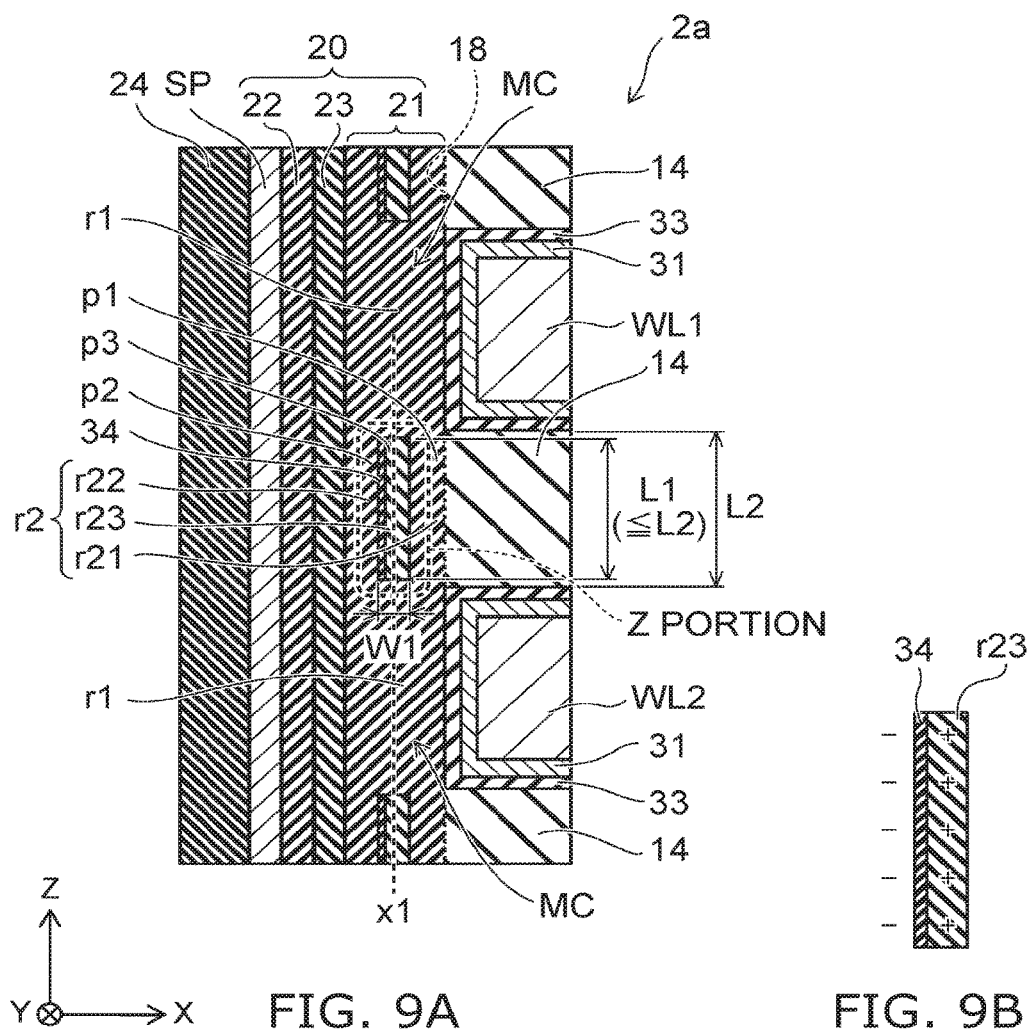
FIG. 9A is a schematic partial cross-sectional view illustrating the semiconductor memory device according to a third embodiment.
FIG. 9B is an enlarged schematic view of a Z portion of FIG. 9A.

FIG. 9A is a schematic partial cross-sectional view illustrating the semiconductor memory device according to a third embodiment.

FIG. 9B is an enlarged schematic view of a Z portion of FIG. 9A.

The semiconductor memory device 2a according to the embodiment further includes a fourth insulating film 34. The fourth insulating film 34 is provided between the silicon nitride film r23 and the second silicon oxide film r22. As the fourth insulating film 34, for example, aluminum oxide such as $Al_2O_3$ is used.

The thickness of the fourth insulating film 34 is 0.1 nm or more and 0.5 nm or less, for example. In the embodiment, the second silicon oxide film r22, the fourth insulating film 34 and silicon nitride film r23 are provided in this order from the side of the semiconductor pillar SP. In this case, a potential that inverts the semiconductor pillar SP of an interlayer portion, that is, the necessary potential so as to make the semiconductor pillar SP into a state that be able to send a current becomes higher. It is difficult to generate electrons in the semiconductor pillar SP (the channel layer), when the necessary potential becomes higher. According to this, the characteristic of cut off can be made better. The erroneous writing from the neighboring cell can be suppressed.

Figures 10A, 10B:
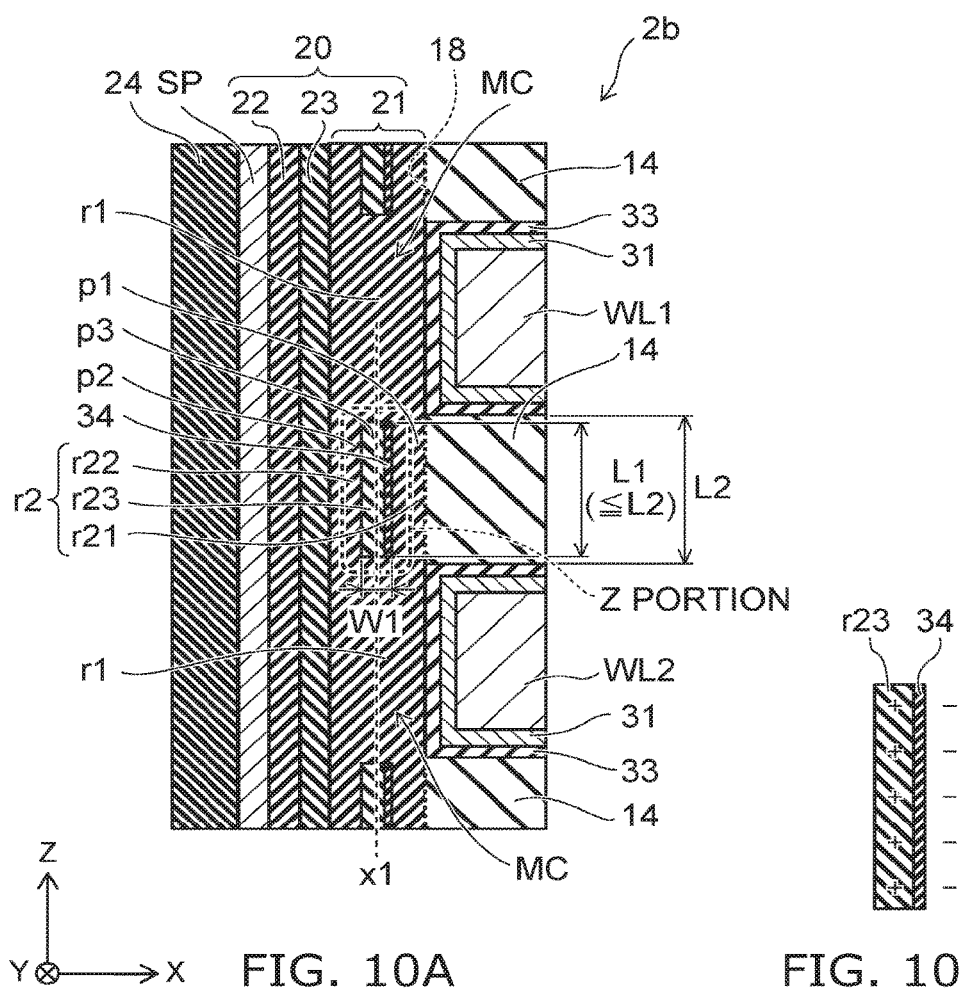
FIG. 10A is a schematic partial cross-sectional view illustrating the semiconductor memory device according to the third embodiment.
FIG. 10B is an enlarged schematic view of a Z portion of FIG. 10A.

FIG. 10A is a schematic partial cross-sectional view illustrating the semiconductor memory device according to the third embodiment.

FIG. 10B is an enlarged schematic view of a Z portion of FIG. 10A.

The semiconductor memory device 2b according to the embodiment further includes a fourth insulating film 34. The fourth insulating film 34 is provided between the silicon nitride film r23 and the first silicon oxide film r21. As the fourth insulating film 34, for example, aluminum oxide such as $Al_2O_3$ is used.

The thickness of the fourth insulating film 34 is 0.1 nm or more and 0.5 nm or less, for example. In the embodiment, the silicon nitride film r23, the fourth insulating film 34 and the first silicon oxide film r21 are provided in this order from the side of the semiconductor pillar SP. In this case, a potential that inverts the semiconductor pillar SP of an interlayer portion, that is, the necessary potential so as to make the semiconductor pillar SP into a state that be able to send a current becomes lower. A tunnel electric field is relieved when the data erase, the injection of the holes into the interlayer portion can be suppressed, when the necessary potential becomes lower. Here, the holes injected into the interlayer portion are captured by the charge storage film 23. The holes captured by the charge storage film 23 continue remaining after writing the data to the memory cell MC. In this result, the holes are located at neighbor of the electrons in the memory cell MC. The electrons in the memory cell MC are drawn to a side of the interlayer portion, the horizontal missing electronic from the memory cell MC occurs. According to the embodiment, the injection of the holes into the interlayer portion can be suppressed. Thereby, the horizontal missing electronic from the memory cell MC is suppressed.

Fourth Embodiment

FIG. 11A, FIG. 11B, FIG. 12A and FIG. 12B are schematic cross-sectional views in the order of steps illustrating the method for manufacturing the semiconductor memory device according to a fourth embodiment.

The fourth embodiment is a method for manufacturing the semiconductor memory device 2a according to the third embodiment.

In the embodiment, steps illustrated in FIG. 5A-FIG. 5C are implemented.

Figure 11A:
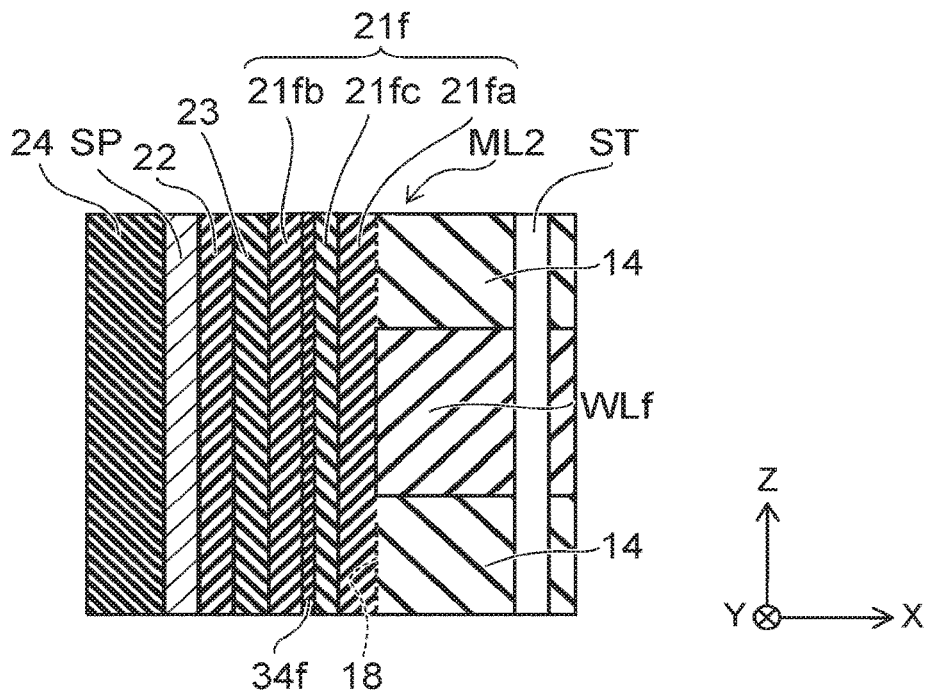
FIG. 11A is a schematic cross-sectional view in the order of steps illustrating the method for manufacturing a semiconductor memory device according to a fourth embodiment.

As shown in FIG. 11A, along an inner side surface of the through-hole 18, an insulating layer 21f which becomes a first insulating film 21 is formed. Specifically, along an inner side surface of the through-hole 18, a first silicon oxide layer 21fa is formed. Along an inner side surface of the first silicon oxide layer 21fa, a silicon nitride layer 21fc is formed. Along an inner side surface of the silicon nitride layer 21fc, a fourth insulating layer 34f which becomes a fourth insulating film 34 is formed. Along an inner side surface of the fourth insulating layer 34f, a second silicon oxide layer 21fb is formed. In this manner, the insulating layer 21f is formed.

Then, along an inner side surface of the second silicon oxide layer 21fb, for example, silicon nitride is deposited, whereby a charge storage film 23 is formed.

Along an inner side surface of the charge storage film 23, for example, silicon oxide is deposited, whereby a second insulating film 22 is formed.

Along an inner side surface of the second insulating film 22, for example, amorphous silicon is deposited, and then, amorphous silicon is crystallized (converted to polysilicon) by performing an annealing treatment, whereby a semiconductor pillar SP is formed. Incidentally, an inside of the semiconductor pillar SP is filled with for example, silicon oxide such as $SiO_2$ as a core material 24.

A slit ST which pierces the memory stacked body ML2 in the Z-direction to reach the substrate 11 is formed. The slit ST extends in the Y-direction.

Figure 11B:
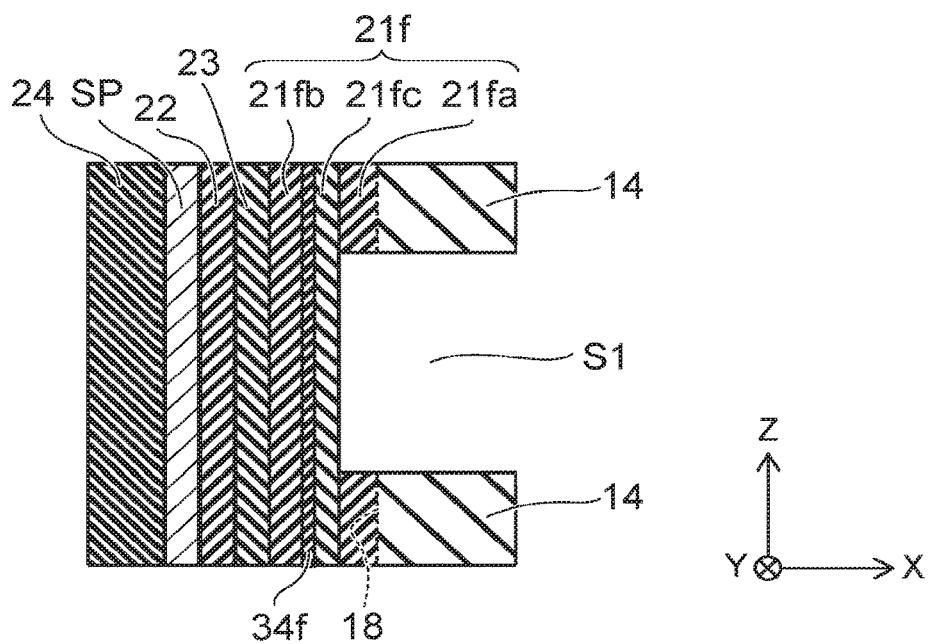
FIG. 11B is a schematic cross-sectional view in the order of steps illustrating the method for manufacturing a semiconductor memory device according to the fourth embodiment.

As shown in FIG. 11B, the sacrifice film WLf is removed through the slit ST.

Further, a portion of the first silicon oxide layer 21*fa* exposed by removing the sacrifice film WLf is removed. Thereby, a space S1 is formed in the portion where the sacrifice film WLf and the portion of the first silicon oxide layer 21*fa* are removed.

Figure 12A:
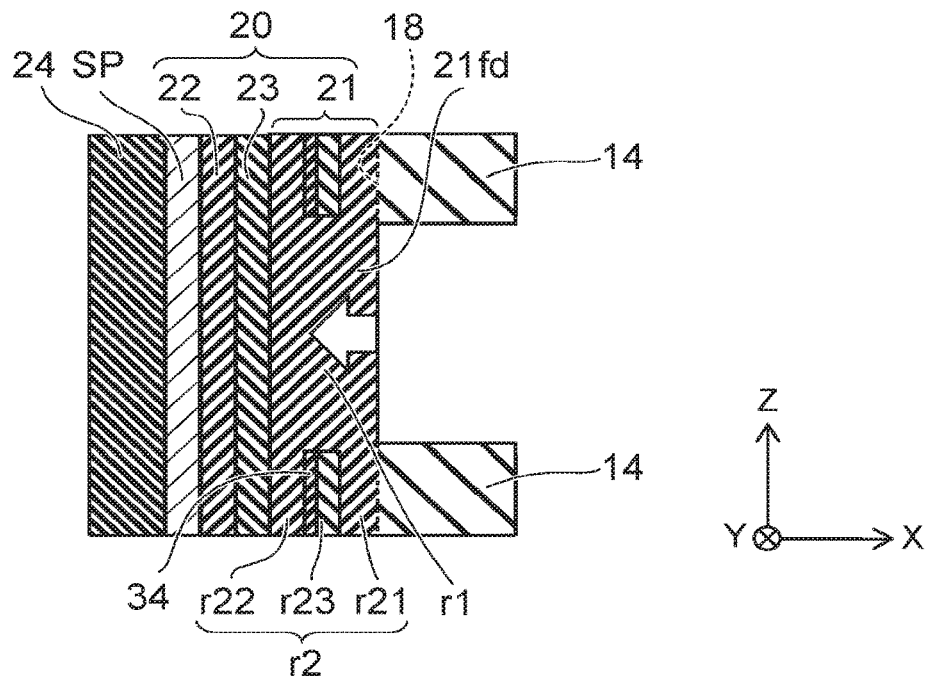
FIG. 12A is a schematic cross-sectional view in the order of steps illustrating the method for manufacturing a semiconductor memory device according to the fourth embodiment.

As shown in FIG. 12A, the portion of the silicon nitride layer 21*fc* exposed in the space S1 is oxidized, whereby a third silicon oxide layer 21*fd* is formed. The oxidation is, for example, radical oxidation. Thereby, the first insulating film 21 is formed. Here, it is considered that the fourth insulating layer 34*f* remains as thin film, for example. It is considered that the fourth insulating layer 34*f* diffuses into the first insulating film 21, and is added to the first insulating film 21 by subsequent heating process, for example. It is considered that the fourth insulating layer 34*f* diffuses into the first insulating film 21, and is absorbed into the charge storage film 23 and the third insulating film 33 by subsequent heating process, for example. In this manner, a first insulating region r1 and a second insulating region r2 are formed.

Figure 12B:
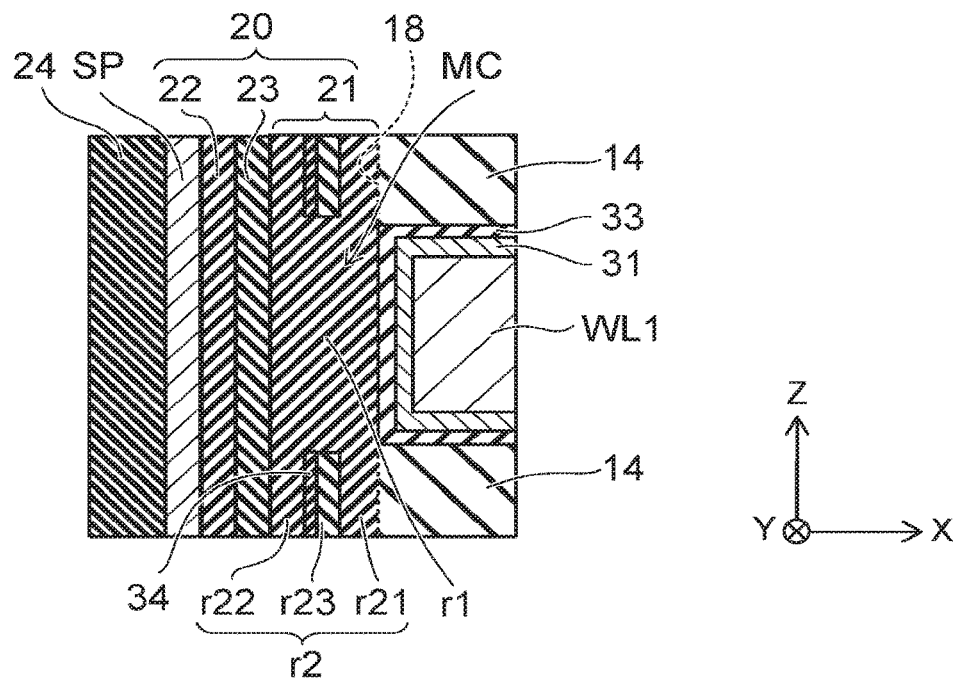
FIG. 12B is a schematic cross-sectional view in the order of steps illustrating the method for manufacturing a semiconductor memory device according to the fourth embodiment.

As shown in FIG. 12B, a third insulating film 33, a barrier metal film 31, and a first electrode film WL1 are formed in this order from an inner wall surface of the space S1. In this manner, the sacrifice film WLf is replaced with the first electrode film WL1. The same shall apply to the electrode films WL other than the first electrode film WL1. Then, on the upper gate stacked body ML3, a plug conductive layer 25, a bit line BL, and a source layer SL are formed in this order.

As described above, the semiconductor memory device 2*a* having a stacked structure of FIG. 9A can be obtained.

According to the embodiments described above, a semiconductor memory device having favorable data erasing characteristics and a method for manufacturing the same can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A device, comprising:
   a first electrode film extending in a first direction;
   a second electrode film being provided separately from the first electrode film in a second direction intersecting the first direction and extending in the first direction;
   an interlayer insulating film being provided between the first electrode film and the second electrode film;
   a semiconductor pillar piercing the first electrode film, the second electrode film, and the interlayer insulating film in the second direction;
   a first insulating film including a first insulating region and a second insulating region, the first insulating region being provided between the first electrode film and the semiconductor pillar and between the second electrode film and the semiconductor pillar, and the second insulating region being provided between the interlayer insulating film and the semiconductor pillar;
   a second insulating film directly contacting the semiconductor pillar; and
   a charge storage film directly contacting and between the second insulating film and the first insulating film, the first insulating film including (i) a first silicon oxide layer, (ii) a second silicon oxide layer, (iii) a silicon nitride layer between the first silicon oxide layer and the second silicon oxide layer, wherein the maximum length of the silicon nitride layer along the second direction is shorter than a first length of the interlayer insulating film along the second direction,
   a first concentration of nitrogen in a first position of the second insulating region being higher than a second concentration of nitrogen in a second position of the second insulating region between the first position and the semiconductor pillar, and
   an average concentration of nitrogen in the first insulating region being lower than the first concentration of the nitrogen in the first position.

2. The device according to claim 1, wherein
   a third concentration of nitrogen in a third position between the first position and the interlayer insulating film is lower than the first concentration of the nitrogen in the first position.

3. The device according to claim 2, further comprising the charge storage film being provided between the semiconductor pillar and the first insulating film.

4. The device according to claim 3, further comprising the second insulating film being provided between the semiconductor pillar and the charge storage film.

5. The device according to claim 3, wherein
   the first insulating region is provided between the first electrode film and the charge storage film and between the second electrode film and the charge storage film, and includes silicon oxide, and
   the second insulating region is provided between the interlayer insulating film and the charge storage film, and includes silicon nitride.

6. The device according to claim 5, wherein
   a silicon nitride film is provided on the first position,
   a first silicon oxide film is provided on the second position, and
   a second silicon oxide film is provided on the third position.

7. The device according to claim 6, wherein
   a first length along the second direction of the silicon nitride film is shorter than a second length along the second direction of the interlayer insulating film.

8. The device according to claim 3, wherein the charge storage film includes silicon nitride.

9. The device according to claim 4, wherein the second insulating film includes silicon oxide.

10. The device according to claim 1, further comprising:
    a barrier metal film being provided between the first electrode film and the first insulating region and between the first electrode film and the interlayer insulating film; and
    a third insulating film being provided between the barrier metal film and the first insulating region and between the barrier metal film and the interlayer insulating film.

11. The device according to claim 10, wherein the third insulating film includes aluminum oxide.

12. The device according to claim 1, wherein the interlayer insulating film includes silicon oxide.

13. The device according to claim 6, further comprising a fourth insulating film being provided between the silicon nitride film provided on the first position and the first silicon oxide film provided on the second position.

14. The device according to claim 13, wherein the fourth insulating film includes aluminum oxide.

15. The device according to claim 6, further comprising a fourth insulating film being provided between the silicon nitride film provided on the first portion and the second silicon oxide film provided on the third portion.

16. The device according to claim 15, wherein the fourth insulating film includes aluminum oxide.

\* \* \* \* \*